(12) United States Patent
Kitahara

(10) Patent No.: US 10,794,560 B2
(45) Date of Patent: Oct. 6, 2020

(54) ILLUMINATION DEVICE

(71) Applicant: Tokyo Parts Industrial Co., Ltd., Gunma-ken (JP)

(72) Inventor: Takahisa Kitahara, Gunma-ken (JP)

(73) Assignee: Tokyo Parts Industrial Co., Ltd. (JP)

( * ) Notice: Subject to any disclaimer, the term of this patent is extended or adjusted under 35 U.S.C. 154(b) by 0 days.

(21) Appl. No.: 16/665,089

(22) Filed: Oct. 28, 2019

(65) Prior Publication Data

US 2020/0158304 A1 May 21, 2020

(30) Foreign Application Priority Data

Nov. 19, 2018 (JP) .................................. 2018-216082

(51) Int. Cl.

| | | |
|---|---|---|
| *F21S 41/141* | (2018.01) | |
| *F21S 41/19* | (2018.01) | |
| *H01L 33/62* | (2010.01) | |
| *F21S 41/20* | (2018.01) | |
| *B60Q 1/26* | (2006.01) | |
| *F21Y 115/10* | (2016.01) | |
| *F21W 102/40* | (2018.01) | |

(52) U.S. Cl.
CPC ........... *F21S 41/192* (2018.01); *F21S 41/141* (2018.01); *F21S 41/285* (2018.01); *H01L 33/62* (2013.01); *B60Q 1/2669* (2013.01); *F21W 2102/40* (2018.01); *F21Y 2115/10* (2016.08)

(58) Field of Classification Search
None
See application file for complete search history.

(56) References Cited

U.S. PATENT DOCUMENTS

| | | | | |
|---|---|---|---|---|
| 2011/0320024 A1* | 12/2011 | Lin | ..................... | F21V 5/007 700/98 |
| 2014/0022804 A1* | 1/2014 | Konishi | ................. | F21S 41/43 362/487 |
| 2014/0168896 A1* | 6/2014 | Fujiwara | ............ | H05K 7/20445 361/697 |

FOREIGN PATENT DOCUMENTS

| | | |
|---|---|---|
| JP | 2006009279 A | 1/2006 |
| JP | 2009133133 A | 6/2009 |
| JP | 2010229797 A | 10/2010 |

* cited by examiner

*Primary Examiner* — Sharon E Payne
(74) *Attorney, Agent, or Firm* — Jordan and Koda, PLLC

(57) ABSTRACT

An illumination device includes a case, a lens body, an LED substrate, a stopper member, and a lead wire. The lens body is fixed in the case. An illuminating part of the lens body projects outward from the upper face opening of the case. The LED substrate is housed in the substrate housing part of the lens body, and the lower surface of the LED substrate is supported by the stopper member. The two lead wires are connected to the LED, led out of the case through insertion holes in the stopper member, and retained by one of lead wire retainers formed on the two side surfaces of the case.

8 Claims, 16 Drawing Sheets

ILLUMINATION DEVICE

BACKGROUND OF THE INVENTION

The present invention relates to an illumination device that can be suitably used for a vehicle or the like.

Japanese Patent Laid-Open Publication No. 2010-229797 discloses a vehicle illumination device in which an illumination means is fixed to an exterior door handle that is mounted on a door of a vehicle and provides foot lighting. This illumination means has a mounting substrate on which the LED is mounted and a lens part that also serves as a case for housing this mounting substrate. The interior of this lens part is sealed using a sealing resin, after the mounting substrate has been housed therein.

In the illumination means disclosed in Japanese Patent Laid-Open Publication No. 2010-229797, the mounting substrate is mounted on the inside of the lens part by the sealing resin alone. For this reason, when a tensile force is applied to a harness connected to the mounting substrate, the sealing resin is liable to crack, and there is a risk that the mounting substrate will detach from the lens part.

Furthermore, the lighting means described in Japanese Patent Laid-Open Publication No. 2010-229797 has an overall asymmetrical shape, and therefore there is a problem in terms of increased manufacturing costs, because it is necessary to prepare two different types, for the door handle used on the right side of the vehicle and the door handle used on the left side of the vehicle.

SUMMARY OF THE INVENTION

One or more embodiments of the present invention provide an illumination device capable of solving the problems of the prior art described above.

Note that, in the aspects described below, the constituent elements can be used in the most freely chosen combinations possible. Furthermore, the aspects and technical features of the present invention are not limited to those described hereafter, and are to be understood based on the description in the entire specification and the drawings or the inventive ideas that can be grasped by the skilled artisan and on the basis of these descriptions.

One mode of embodiment of the illumination device of the present invention has:

a case, which has an upper face opening and a lower face opening;

a lens body, which has an opening part on the lower side, and is fixed in the case;

a substrate, which is housed inside the lens body, and has an LED mounted on an upper surface thereof;

a stopper member, which is mounted on the inside of the lens body, and which supports the lower surface of the substrate; and two lead wires, which are connected to the LED via the substrate, and which are led out of the case through the stopper member, wherein: the case has a lead wire retainer on each of two mutually opposite outer surfaces;

the lens body has an illuminating part protruding upward;

the illuminating part protrudes to the outside of the case from the upper face opening; and the two lead wires are retained by one of the two lead wire retainers.

Another mode of embodiment of the illumination device of the present invention has:

a case, which has an upper face opening and a lower face opening;

a lens body, which has an opening part on the lower side, and is fixed in the case;

a substrate, which is housed inside the lens body, and has an LED mounted on an upper surface thereof; and a stopper member, which is mounted on the inside of the lens body, and which supports the lower surface of the substrate;

two lead wires, which are connected to the LED via the substrate, and which are led out of the case through the stopper member, wherein: the lens body has an illuminating part protruding upward and lead wire retainers provided on two mutually opposite outer surfaces;

the illuminating part protrudes to the outside of the case from the upper face opening; and the two lead wires are retained by one of the two lead wire retainers.

With the present invention, even if a certain amount of tensile force is applied to the lead wires, it is possible to effectively prevent the lead wires from being detached from the substrate on which the LED is mounted, or the substrate from being detached from the lens body, resulting in a highly reliable illumination device. Furthermore, with the present invention, even if the illuminating part of the lens body is formed at an offset position, a single type of illumination device can be used, for example, for both the right side and the left side of the vehicle.

DETAILED DESCRIPTION OF THE PREFERRED EMBODIMENTS

Figure 1:
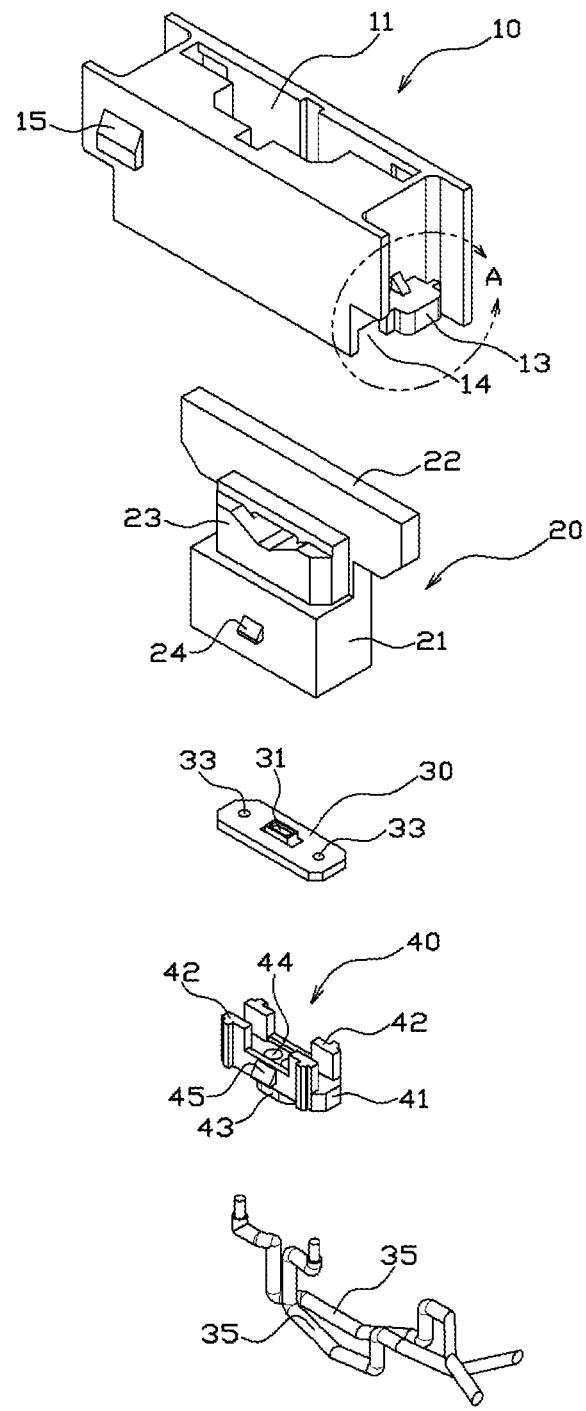
FIG. 1 is an exploded perspective view of an illumination device according to a first exemplary mode of embodiment, as viewed from above.
Figure 2:
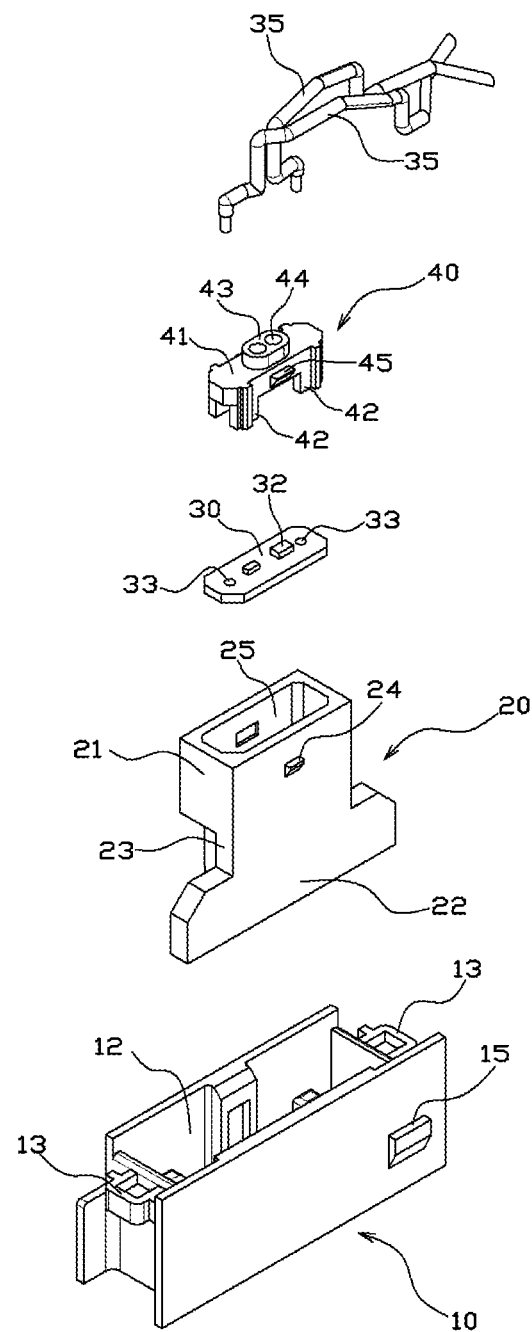
FIG. 2 is an exploded perspective view of the illumination device according to the first exemplary mode of embodiment, as viewed from below.
Figure 9:
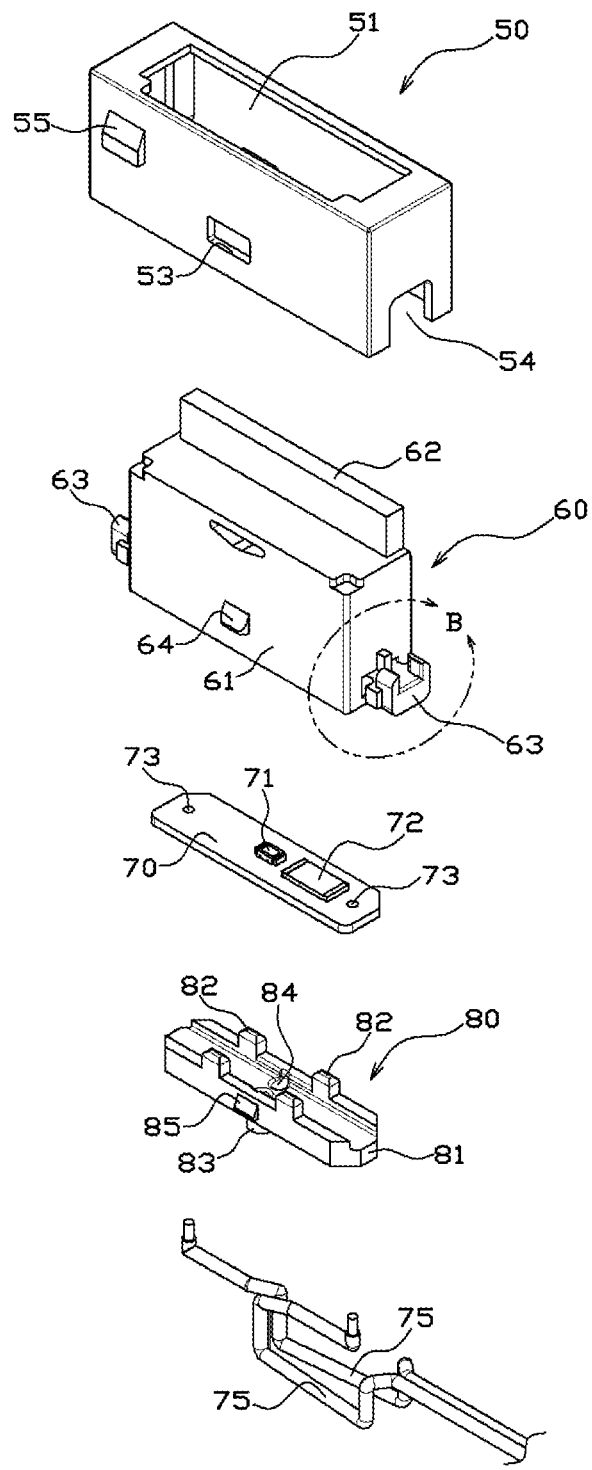
FIG. 9 is an exploded perspective view of an illumination device according to a second exemplary mode of embodiment, as viewed from above.
Figure 10:
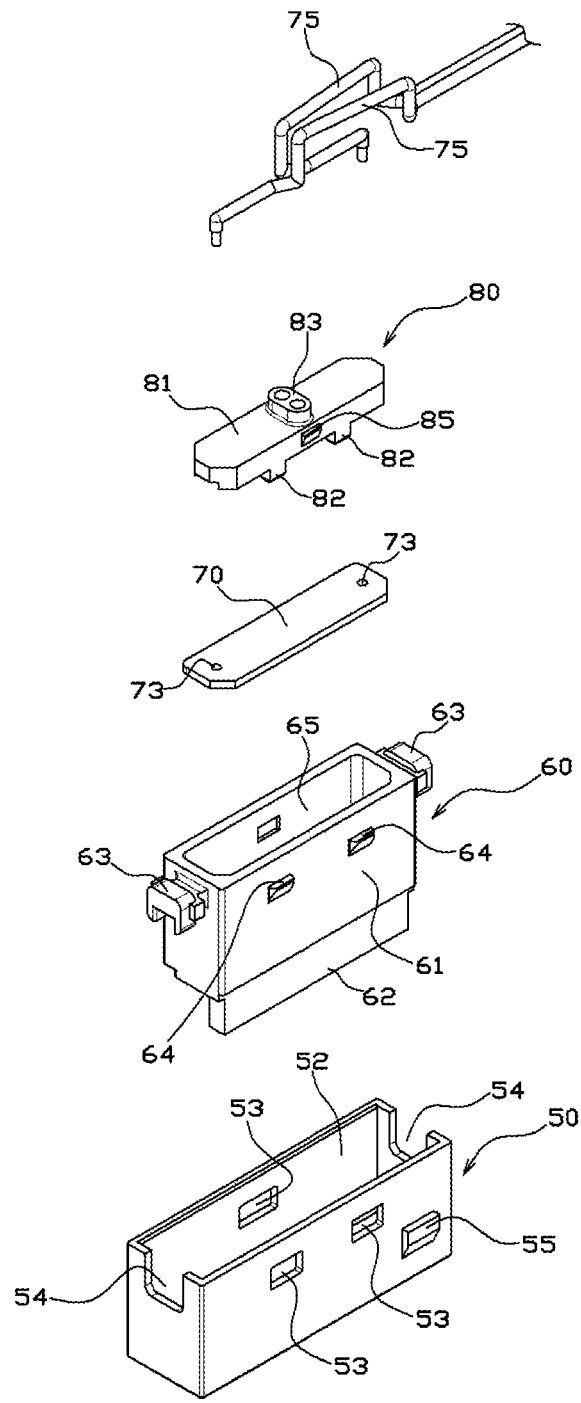
FIG. 10 is an exploded perspective view of the illumination device according to the second exemplary mode of embodiment, as viewed from below.

Hereafter, exemplary modes of embodiment of the present invention are described with reference to the drawings. In the present specification, the upward direction in FIG. 1 and FIG. 9 is referred to as "above" or "upper" and the downward direction in FIG. 1 and FIG. 9 is referred to as "below" or "lower". These upward and downward directions do not indicate the direction when the illumination device of the present invention is mounted on a vehicle or the like.

First Exemplary Mode of Embodiment

An illumination device 1A according to the first exemplary mode of embodiment of the present invention will be described with reference to FIG. 1 through FIG. 8. The illumination device 1A of this example can be used, for example, as an illumination device that is installed on a vehicle door and illuminates the periphery of an exterior door handle.

The illumination device 1A principally comprises a case 10, a lens body 20 having an illuminating part 22, a substrate 30 on which an LED 31 is mounted, two lead wires 35 connected to the LED 31 via the substrate 30, and a stopper member 40.

The case 10 houses the lens body 20 therein, and has an overall substantially rectangular appearance, having openings 11 and 12 in the upper and lower surfaces, respectively. The upper face opening 11 is provided at a position offset to one side from the center of the upper surface of the case 10. Meanwhile, the lower face opening 12 is large and formed over the entire lower surface of the case 10 in order to accommodate the lens body 20. The lens body 20 is inserted into the case 10 from the lower face opening 12, and the illuminating part 22 of the lens body 20 protrudes to the outside of the case 10, from the upper face opening 11.

A lead wire retainer 13 is provided on each of two mutually opposite outer surfaces of the case 10, and a projecting locking claw 15 is provided on each of the other two outer surfaces. Furthermore, the case 10 has cutaways 14 that are locally opened in the vicinity of the two lead wire retainers 13. As will be described in detail hereafter, the two lead wires 35 are led out of the case 10 from one of the two cutaways 14 and retained by one of the two lead wire retainers 13.

The lens body 20 is formed by injection molding a translucent resin material in which a light diffusing agent is dispersed, in order to guide and diffuse light from the LED 31. This lens body 20 has a substrate housing part 21 having an internal space, a light guide part 23 extending upward from the substrate housing part 21, and an illuminating part 22, which is formed widening at the upper end of the light guide part 23.

An opening part 25 is provided on the lower side of the substrate housing part 21, and the substrate 30 is received through this opening part 25, so that the surface on which the LED 31 is mounted is located on the upper side. The shape of the illuminating part 22 is elongated in the direction in which the two lead wire retainers 14 are opposed. The light from the LED 31 is guided to the illuminating part 22 via the light guide part 23, diffused throughout the illuminating part 22, and irradiated to the outside.

Protruding locking claws 24 are provided on two mutually opposite outer surfaces of the substrate housing part 21. The lens body 20 is fixed in the case 10 by locking the locking claws 24 in locking parts (not shown) such as grooves provided inside the case 10.

The substrate 30 consists of a double-sided printed circuit board, and an LED 31 is mounted on the upper surface, while a chip resistor 32 is mounted on the lower surface. This substrate 30 has substantially the same shape as the opening part 25 of the substrate housing part 21, and a portion of the outer periphery of the upper surface of the substrate 30 abuts on a stepped part (not shown) inside the case 10, so as to achieve upward positioning.

The stopper member 40 has: a flat bottom plate 41; four support legs 42 protruding upward from the four corners of the bottom plate 41; an insertion part 43 provided with two insertion holes 44 protruding downward from the center of the bottom plate 41; and locking claws 45 provided on two mutually opposite side surfaces of the bottom plate 41.

This stopper member 40 is mounted inside the lens body 20, so as to close the opening part 25 in the lens body 20, and supports the lower surface of the substrate 30. Specifically, the stopper member 40 is fixed to the inside of the lens body 20 by locking the locking claws 45 in locking parts (not shown) such as grooves provided inside the lens body 20, and the four corners on the lower surface of the substrate 30 are supported by four support legs 42.

The two lead wires 35 are connected to the LED 31 via the two connection holes 33 in the substrate 30 and led out of the case 10 through the insertion holes 44 in the stopper member 40. The two lead wires 35 are retained by one of the two lead wire retainers 13 (in this example, the lead wire retainer 13 on the right in FIG. 6).

Figure 3:
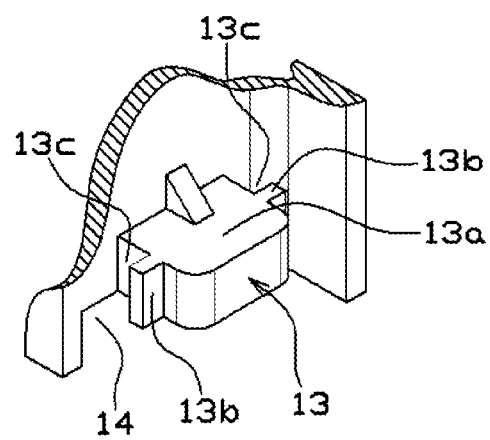
FIG. 3 is an enlarged view of a part A in FIG. 1.
Figure 4:
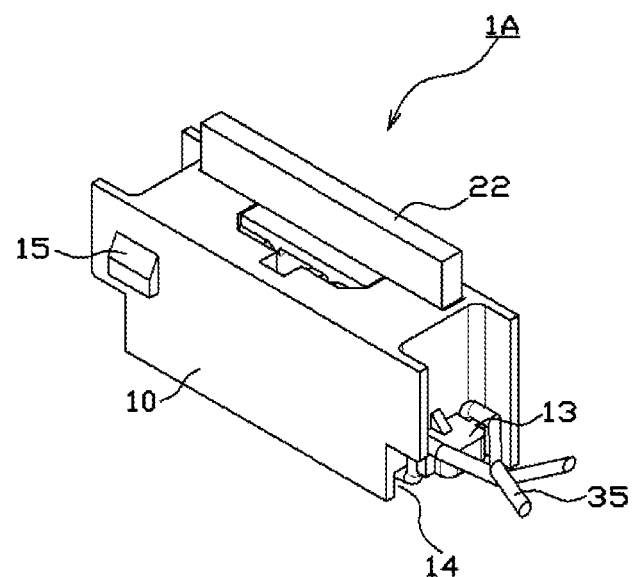
FIG. 4 is an overall perspective view of the illumination device according to the first exemplary mode of embodiment, as viewed from above.
Figure 5:
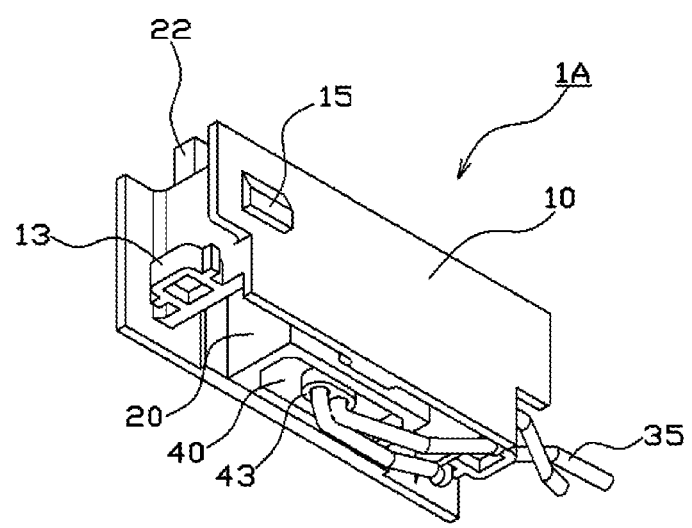
FIG. 5 is an overall perspective view of the illumination device according to the first exemplary mode of embodiment, as viewed from below.
Figure 6:
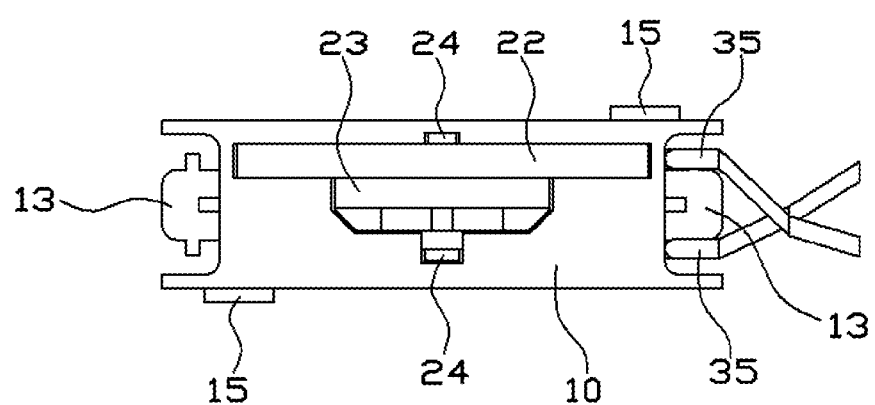
FIG. 6 is a top view of the illumination device according to the first exemplary mode of embodiment.
Figure 7:
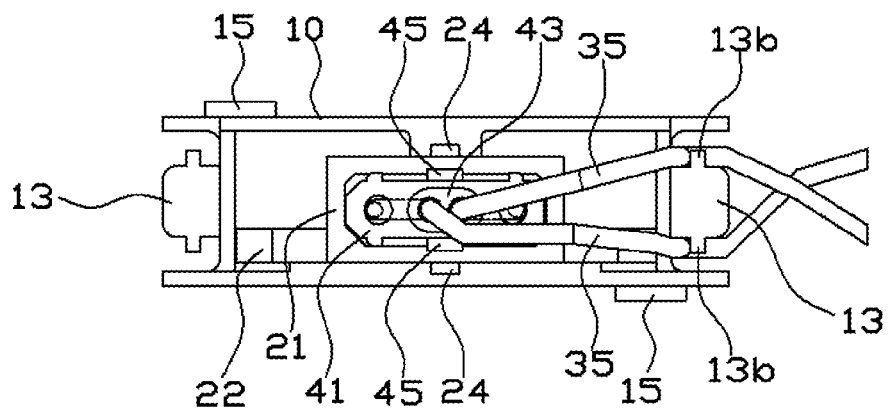
FIG. 7 is a bottom view of the illumination device according to the first exemplary mode of embodiment.
Figure 8:
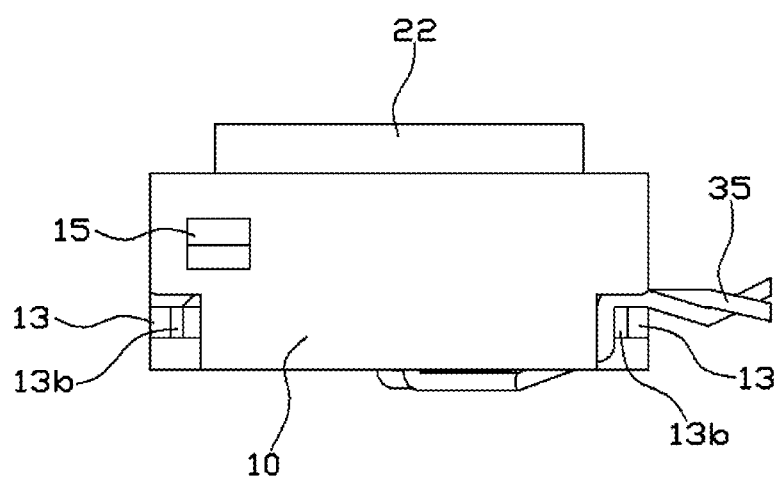
FIG. 8 is a front view of the illumination device according to the first exemplary mode of embodiment.

As shown in FIG. 3, the lead wire retainer 13 includes a block-shaped retaining base 13a, protruding parts 13b protruding from two opposite side surfaces of the retaining base 13a, and lead-out grooves 13c formed between a side surface of the case 10 and the protruding parts 13b. These lead-out grooves 13c are passages that fit the cross section of the lead wire 35.

The two lead wires 35 are led out to the outside through the cutaway 14 in the side surface of the case, bent at substantial right angles, so as to be passed through the lead-out grooves 13c, and further bent at substantially right angles and twisted together. Thus, the two lead wires 35 are bent at substantially rights angle at least twice, and are twisted together so that they are stably retained in the lead wire retainer 13.

Note that, if necessary, a filler made of a soft resin is filled onto the lower surface of the stopper member 40 so as to close the opening part 25 of the lens body 20 and the insertion holes 44 in the stopper member 40, whereby the illumination device 1A is completed.

The illumination device 1A of this example is mounted in a door by locking the locking claws 15 on the case 10 to locking parts (not shown), such as grooves provided in the door side of the vehicle. In this mounted state, the illuminating part 22 is positioned at an illumination opening formed in an elongated shape in the front-rear direction of the vehicle body on the outer surface of the door, and can illuminate the periphery of the exterior door handle.

In the illumination device 1A of this example described above, the substrate 30 that is housed inside the lens body 20 is supported by the stopper member 40. In addition, the two lead wires 35 can be stably retained by the lead wire retainer 13 that is formed integrally with the case 10. For this reason, even if a certain amount of tensile force is applied to the lead wires 35, it is possible to effectively prevent the lead wires 35 from being detached from the substrate 30, or the substrate 30 from being detached from the lens body 20, resulting in a highly reliable illumination device. Furthermore, if filling is performed with a soft filler so as to close the opening part 25 in the lens body 20, in order to give the illumination device a waterproof structure, it is possible to effectively prevent cracks from forming in the filler, such that good waterproof performance can be maintained for long periods of time.

In particular, illumination devices mounted on the doors of vehicles may be constrained to an asymmetric structure due to structural restrictions presented by the vehicle and, thus, two types of illumination devices conventionally had to be provided, for the right side and the left side of the vehicle. However, with the illumination device 1A of this example, while the illuminating part 22 protrudes from the upper face opening 11 to the outside of the case at a position offset to one side from the center of the case 10, and thus has an asymmetric structure, the illumination device 1A can be used both for the right side and the left side of the vehicle. Specifically, the lead wire retainers 13 are provided on the two mutually opposite outer surfaces of the case 10, and when used for the right side of the vehicle, one of the two lead wire retainers retains both of the two lead wires, and when used for the left side of the vehicle, the other of the two lead wire retainers retains both of the two lead wires. Thus, even though it has an asymmetric structure, it can be used for both the right side and the left side of the vehicle.

Second Exemplary Mode of Embodiment

An illumination device 1B according to a second exemplary mode of embodiment of the present invention will be described with reference to FIG. 9 through FIG. 16. The illumination device 1B of this example principally comprises a case 50, a lens body 60 having an illuminating part 62, a substrate 70 on which an LED 71 is mounted, two lead wires 75 connected to the LED 71 via the substrate 70, and a stopper member 80.

The case 50 houses the lens body 60 therein, and has an overall substantially rectangular appearance, having openings 51 and 52 in the upper and lower surfaces, respectively. A cutaway 54 for leading the lead wires 75 to the outside is provided in each of the mutually opposite outer surfaces of the case 50, and a locking hole 53 and a locking claw 55 are provided on each of the other two outer surfaces. The lens body 60 is inserted into the case 50 from the lower face opening 52, and the illuminating part 62 of the lens body 60 protrudes to the outside of the case 50 from the upper face opening 51.

The lens body 60 is formed by injection molding a translucent resin material in which a light diffusing agent is dispersed, in order to guide and diffuse light from the LED 71. This lens body 60 has a substrate housing part 61 having an internal space and an illuminating part 62 formed at the upper end of the substrate housing part 61. The illuminating part 62 is elongated in the direction in which the two cutaways 54 in the case 50 are opposed, and the light from the LED 71 is guided and diffused throughout the illuminating part 62 and is irradiated to the outside.

An opening part 65 is provided on the lower side of the substrate housing part 61, and the substrate 70 is received through this opening part 65, so that the surface on which the LED 71 is mounted is located on the upper side.

A lead wire retainer 63 is provided on each of the two outer surfaces of the substrate housing part 61 facing the cutaways 54 in the case 50. Furthermore, projecting locking claws 64 are provided on each of the other two mutually opposite outer surfaces of the substrate housing part 61. The lens body 60 is fixed in the case 50 by locking the locking claws 64 in the locking holes 53 in the case 50. As will be described in detail below, the two lead wires 75 are retained by one of the two lead wire retainers 63 and led out of the case 50 from one of the two cutaways 54.

The substrate 70 consists of a single-sided (upper surface) printed circuit board, and an LED 71 and a chip resistor 72 are mounted on the upper surface. This substrate 70 has substantially the same shape as the opening part 65 of the substrate housing part 61, and the outer periphery of the upper surface of the substrate 70 abuts on a stepped part (not shown) inside the case 50, so as to achieve upward positioning.

The stopper member 80 has: a flat bottom plate 81; four support legs 82 projecting upward from four locations on the bottom plate 81; an insertion part 83 provided with two insertion holes 84 projecting downward from the center of the bottom plate 81; and locking claws 85 provided on two mutually opposite side surfaces of the bottom plate 81.

This stopper member 80 is mounted inside the lens body 60, so as to close the opening part 65 in the lens body 60, and supports the lower surface of the substrate 70. Specifically, the stopper member 80 is fixed to the inside of the lens body 60 by locking the locking claws 85 in locking parts (not shown) such as grooves provided inside the lens body 60, and the four locations on the lower surface of the substrate 70 are supported by the four support legs 82.

The two lead wires 75 are connected to the LED 71 via the two connection holes 73 of the substrate 70 and led out of the lens body 60 through the insertion holes 84 in the stopper member 80. The two lead wires 75 are retained by one of the two lead wire retainers 63 (in this example, the lead wire retainer 63 on the right side in FIG. 15), and are led out to the outside of the case 50 from one of the two cutaways 54.

Figure 11:
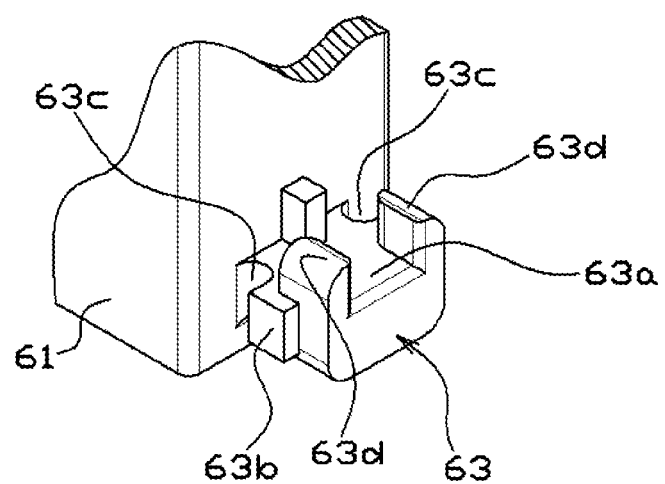
FIG. 11 is an enlarged view of a part B in FIG. 9.
Figure 12:
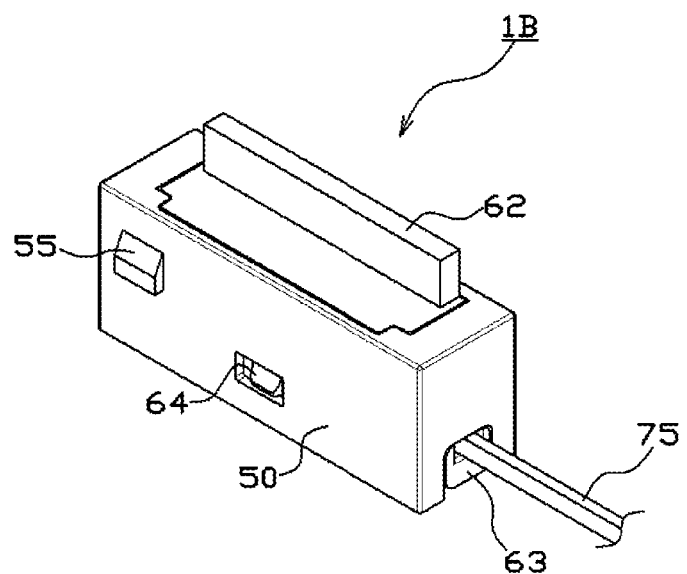
FIG. 12 is an overall perspective view of the illumination device according to the second exemplary mode of embodiment, as viewed from above.
Figure 13:
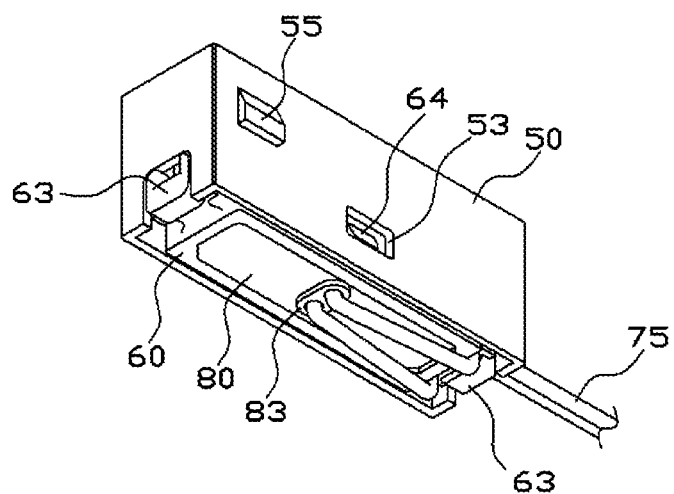
FIG. 13 is an overall perspective view of the illumination device according to the second exemplary mode of embodiment, as viewed from below.
Figure 14:
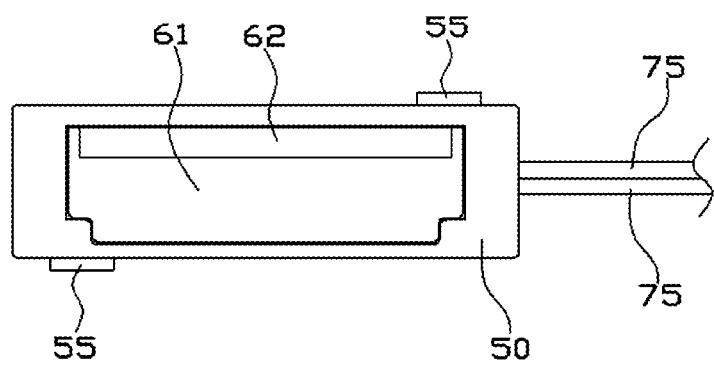
FIG. 14 is a top view of the illumination device according to the second exemplary mode of embodiment.
Figure 15:
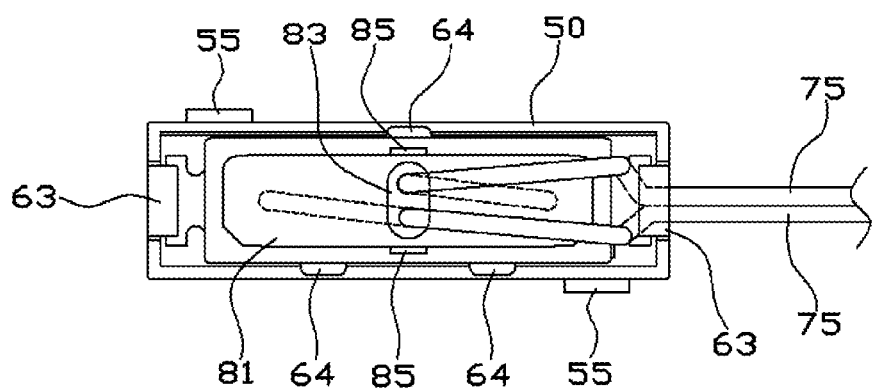
FIG. 15 is a bottom view of the illumination device according to the second exemplary mode of embodiment.
Figure 16:
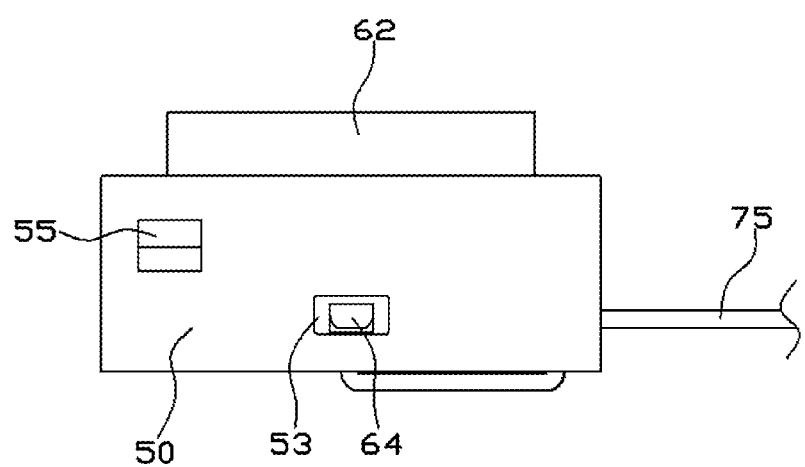
FIG. 16 is a front view of the illumination device according to the second exemplary mode of embodiment.

As shown in FIG. 11, the lead wire retainer 63 includes a block-shaped retaining base 63a, protruding parts 63b protruding from two opposing side surfaces of the retaining base 63a, and lead-out grooves 63c formed between the side surfaces of the substrate housing part 61 and the protruding parts 63b. These lead-out grooves 63c are passages that fit the cross section of the lead wire 75.

The two lead wires 75 are led out to the outside from the lower end of the substrate housing part 61, bent at a substantially right angle, so as to be passed through the lead-out groove 63c, and further bent at a substantially right angle, so as to be placed on the retaining base 63a. When the lens body 60 is fixed in the case 50 in this state, the two lead wires 75 are sandwiched between the upper section of the cutaway 54 in the case 50 and the retaining base 63a. As described above, the two lead wires 75 are bent at a substantially right angle at least twice, and are sandwiched between the upper section of the cutaway 54 in the case 50 and the retaining base 63a, so that they are stably retained in the lead wire retainer 63.

Note that, if necessary, a filler made of a soft resin is filled onto the lower surface of the stopper member 80 so as to close the opening part 65 of the lens body 60 and the insertion hole 84 in the stopper member 80, whereby the illumination device 1B is completed.

The illumination device 1B of this example is mounted in a door by locking the locking claws 55 on the case 50 into locking parts (not shown), such as grooves provided in the door side of the vehicle. In this mounted state, the illuminating part 62 is positioned at an illumination opening formed in an elongated shape in the front-rear direction of the vehicle body on the outer surface of the door, and can illuminate the periphery of the exterior door handle.

In the illumination device 1B of this example described above, the substrate 70 that is housed inside the lens body 60 is supported by the stopper member 80. In addition, the two lead wires 75 can be stably retained by the lead wire retainers 63, which are formed integrally with the lens body 60, and the case 50. For this reason, even if a certain amount of tensile force is applied to the lead wires 75, it is possible to effectively prevent the lead wires 75 from being detached from the substrate 70, or the substrate 70 from being detached from the lens body 60, resulting in a highly reliable illumination device. Furthermore, if filling is performed with a soft filler so as to close the opening part 65 in the lens body 60, in order to give the illumination device a waterproof structure, it is possible to effectively prevent cracks from forming in the filler, such that good waterproof performance can be maintained for long periods of time.

Furthermore, with the illumination device 1B of this example, while the illuminating part 62 protrudes from the upper face opening 51 to the outside of the case at a position offset to one side from the center of the case 50, and thus has an asymmetric structure, the illumination device 1B can be used both for the right side and the left side of the vehicle. Specifically, a lead wire retainer 63 is provided on each of two mutually opposite outer surfaces of the lens body 60, and when used for the right side of a vehicle, one of the two lead wire retainers retains both of the two lead wires, and when used for the left side of the vehicle, the other of the two lead wire retainers retains both of the two lead wires. Thus, even though it has an asymmetric structure, it can be used for both the right side and the left side of the vehicle.

Two exemplary modes of embodiment of the present invention were described above, but the present invention is not limited to these exemplary modes of embodiment, and it is a matter of course that the exemplary modes of embodiment described above can be suitably modified or the like, within a range that does not depart from the gist of the present invention.

For example, with regard to the form of the lead wire retainers 13 and 63, any form is possible as long as two lead wires can be stably retained together.

Furthermore, in the exemplary modes of embodiment described above, the case, the lens body, and the stopper member all employ fastening methods based on locking claws, but any fastening method such as bonding, adhesion, and press-fitting can be adopted as the fastening method.

Furthermore, in the exemplary modes of embodiment described above, a situation in which the illumination device is mounted on the door of a vehicle was described, but the illumination device of the present invention can also be applied to doors in homes, offices and the like.

What is claimed is:

1. An illumination device, having:
   a case having an upper face opening and a lower face opening;
   a lens body, which has an opening part on the lower side, and is fixed in the case;
   a substrate, which is housed inside the lens body, and has an LED mounted on an upper surface thereof;
   a stopper member, which is mounted on the inside of the lens body, and which supports the lower surface of the substrate; and
   two lead wires, which are connected to the LED via the substrate, and which are led out of the case through the stopper member,
   wherein: the case has a lead wire retainer on each of two mutually opposite outer surfaces;
   the lens body has an illuminating part protruding upward;
   the illuminating part protrudes to the outside of the case from the upper face opening; and
   the two lead wires are retained by one of the two lead wire retainers.

2. The illumination device according to claim 1, wherein the illuminating part protrudes to the outside of the case from the upper face opening at a position offset to one side from the center of the case.

3. The illumination device according to claim 1, wherein the illuminating part is elongated in a direction in which the two lead wire retainers are opposed.

4. The illumination device according to claim 1, wherein: the case has cutaways in the vicinities of the two lead wire retainers; and
   the two lead wires are led out of the case from one of the two cutaways.

5. An illumination device, having:
   a case, which has an upper face opening and a lower face opening;
   a lens body, which has an opening part on the lower side, and is fixed in the case;
   a substrate, which is housed inside the lens body, and has an LED mounted on an upper surface thereof;
   a stopper member, which is mounted on the inside of the lens body, and which supports the lower surface of the substrate; and
   two lead wires, which are connected to the LED via the substrate, and which are led out of the case through the stopper member,
   wherein: the lens body has an illuminating part protruding upward and lead wire retainers provided on two mutually opposite outer surfaces;
   the illuminating part protrudes to the outside of the case from the upper face opening; and
   the two lead wires are retained by one of the two lead wire retainers.

6. The illumination device according to claim 5, wherein the illuminating part protrudes to the outside of the case from the upper face opening at a position offset to one side from the center of the case.

7. The illumination device according to claim 5, wherein the illuminating part is elongated in a direction in which the two lead wire retainers are opposed.

8. The illumination device according to claim 5, wherein the case has a cutaway in each of the two side surfaces that respectively face the two lead wire retainers, and the two lead wires are led out of the case from one of the two cutaways.

* * * * *